(12) United States Patent
Sciarrillo

(10) Patent No.: US 11,011,579 B2
(45) Date of Patent: *May 18, 2021

(54) CROSS-POINT MEMORY AND METHODS FOR FABRICATION OF SAME

(71) Applicant: Micron Technology, Inc., Boise, ID (US)

(72) Inventor: Samuele Sciarrillo, Lomagna (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/112,476

(22) Filed: Aug. 24, 2018

(65) Prior Publication Data

US 2019/0013359 A1    Jan. 10, 2019

Related U.S. Application Data

(60) Continuation of application No. 15/858,811, filed on Dec. 29, 2017, now Pat. No. 10,439,001, which is a
(Continued)

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 27/2445* (2013.01);
(Continued)

(58) Field of Classification Search
CPC ............................................ H01L 27/10–1028
See application file for complete search history.

(56) References Cited

U.S. PATENT DOCUMENTS 6,404,003 B1   6/2002 McMillan et al.
7,482,616 B2   1/2009 Song et al.
(Continued)

FOREIGN PATENT DOCUMENTS

KR    1020040068024 A    7/2004
KR    1020080060321 A    7/2008
KR    1020100018445 A    2/2010

OTHER PUBLICATIONS

ISA/KR International Search Report and Written Opinion of the International Search Authority, Int'l Appl. No. PCT/US2015/015023, dated May 7, 2015, Korean Intellectual Property Office, Republic of Korea, 13 pgs.
(Continued)

*Primary Examiner* — Daniel Luke
(74) *Attorney, Agent, or Firm* — Hollard & Hart LLP

(57) ABSTRACT

The disclosed technology relates generally to integrated circuit devices, and in particular to cross-point memory arrays and methods for fabricating the same. In one aspect, a memory device of the memory array comprises a substrate and a memory cell stack formed between and electrically connected to first and second conductive lines. The memory cell stack comprises a first memory element over the substrate and a second memory element formed over the first element, wherein one of the first and second memory elements comprises a storage element and the other of the first and second memory elements comprises a selector element. The memory cell stack additionally comprises a first pair of sidewalls opposing each other and a second pair of sidewalls opposing each other and intersecting the first pair of sidewalls. The memory device additionally comprises first protective dielectric insulating materials formed on a lower portion of the first pair of sidewalls and an isolation dielectric formed on the first protective dielectric
(Continued)

insulating material and further formed on an upper portion of the first pair of sidewalls.

14 Claims, 11 Drawing Sheets

Related U.S. Application Data division of application No. 15/398,475, filed on Jan. 4, 2017, now Pat. No. 10,157,965, which is a division of application No. 14/189,265, filed on Feb. 25, 2014, now Pat. No. 9,577,010.

(52) U.S. Cl.
CPC ...... *H01L 27/2454* (2013.01); *H01L 27/2463* (2013.01); *H01L 45/06* (2013.01); *H01L 45/1233* (2013.01); *H01L 45/141* (2013.01); *H01L 45/142* (2013.01); *H01L 45/143* (2013.01); *H01L 45/144* (2013.01); *H01L 45/1675* (2013.01)

(56) References Cited

U.S. PATENT DOCUMENTS

| | | | |
|---|---|---|---|
| 7,579,251 B2 | 8/2009 | Imanaka et al. | |
| 7,646,630 B2 | 1/2010 | Lowrey et al. | |
| 7,741,638 B2 | 6/2010 | Stewart et al. | |
| 7,852,658 B2 | 12/2010 | Liu et al. | |
| 7,939,815 B2 | 5/2011 | Lee et al. | |
| 8,093,128 B2 | 1/2012 | Koutny et al. | |
| 8,143,610 B2 | 3/2012 | Park et al. | |
| 8,153,527 B2 | 4/2012 | Loh et al. | |
| 8,203,134 B2 | 6/2012 | Liu | |
| 8,344,513 B2 | 1/2013 | Yu et al. | |
| 8,440,535 B2 | 5/2013 | Dennison | |
| 8,450,714 B2 | 5/2013 | Yasutake | |
| 8,575,019 B2 | 11/2013 | Zhao | |
| 8,575,584 B2 | 11/2013 | Satoh et al. | |
| 8,613,863 B2 | 12/2013 | Tong et al. | |
| 8,623,697 B2 | 1/2014 | Magistretti et al. | |
| 8,748,877 B2 | 6/2014 | Orita et al. | |
| 8,765,581 B2 | 7/2014 | Lee et al. | |
| 8,766,226 B2 | 7/2014 | Nojiri | |
| 8,902,634 B2 * | 12/2014 | Iwayama | H01L 43/08 257/421 |
| 8,937,292 B2 | 1/2015 | Bateman | |
| 9,012,326 B2 | 4/2015 | Kim et al. | |
| 9,093,632 B2 | 7/2015 | Tsubata et al. | |
| 9,129,913 B2 | 9/2015 | Lee | |
| 9,136,307 B2 | 9/2015 | Pellizzer | |
| 9,171,913 B2 | 10/2015 | Kim et al. | |
| 9,245,926 B2 | 1/2016 | Kau et al. | |
| 9,324,945 B2 | 4/2016 | Liu et al. | |
| 9,397,143 B2 | 7/2016 | Rocklein et al. | |
| 9,406,877 B2 | 8/2016 | Tada et al. | |
| 9,748,311 B2 | 8/2017 | Fantini et al. | |
| 9,768,378 B2 | 9/2017 | Pellizzer et al. | |
| 2007/0166980 A1 | 7/2007 | Lee et al. | |
| 2009/0251944 A1 | 10/2009 | Happ et al. | |
| 2009/0302362 A1 | 12/2009 | Kikuchi et al. | |
| 2012/0313064 A1 | 12/2012 | Nishimura | |
| 2013/0016557 A1 | 1/2013 | Kim | |
| 2013/0333835 A1 | 12/2013 | Carcia et al. | |
| 2014/0273524 A1 | 9/2014 | Nguyen et al. | |
| 2015/0137061 A1 | 5/2015 | Donghi et al. | |
| 2015/0171324 A1 | 6/2015 | Mikawa et al. | |
| 2015/0243708 A1 | 8/2015 | Ravasio et al. | |
| 2015/0287916 A1 | 10/2015 | Campbell et al. | |

OTHER PUBLICATIONS

Dameron, et al., "Molecular layer deposition of alucone polymer films using trimethylaluminum and ethylene glycol", Chemical Materials, vol. 20, No. 10, 2008, pp. 3315-3326.

Gonzalez, et al., "Charge Trapping Analysis of Al2O3 Films Deposited by Atomic Layer Deposition using H2O or O3 as Oxidant", Journal of Vacuum Science & Technology B 31 (2013) 01A101, 6 pgs.

Jen, et al., "Critical tensile strain and water vapor transmission rate for nanolaminate films grown using Al2O3 atomic layer disposition and alucone molecular layer deposition", Applied Physics Letters, vol. 101, 234103;, 2012, 3pgs.

Lai, , "Current Status of the Phase Change Memory and its Future", Electron Devices Meeting, Dec. 8-10, 2003, IEDM '03 Technical Digest, IEEE International, pp. 10.1.1-10.1.4.

Lee, et al., "Alucone Alloys with Tunable Properties Using Alucone Molecular Layer Deposition and Al2O3 Atomic Layer Deposition", The Journal of Physical Chemistry C, 116 (2012), pp. 3250-3257.

Lee, et al., "Growth and Properties of Hybrid Organic-Inorganic Metalcone Films Using Molecular Layer Deposition Techniques", Advanced Functional Materials 23 (2013), pp. 532-546.

Liu, et al., "Fabrication of the Si2Sb2Te5 phase change cell structure for PCRAM by using UV nanoimprint lithography", 2008 2nd IEEE International Nanoelectronics Conference, Mar. 24-27, 2008, IEEE, 2008, pp. 807-810.

Miller, et al., "Thermo-Mechanical Properties of Alumina Films Created Using the Atomic Layer Deposition Technique", Sensors and Actuators A:Physical 164 (2010), pp. 58-67.

Miller, et al., "Thermomechanical Properties of Aluminum Alkoxide (alucone) films created using molecular layer deposition", Acta Materialia, Inc. 57 (2009), pp. 5083-5092.

Seghete, et al., "Sacrificial layers for air gaps in NEMS using alucone molecular layer deposition", Sensors and Actuators A: Physical, 2009, 8 pages.

Sniegowski, et al., "IC-Compatible Polysilicon Surface Micromachining", Annu. Rev. Mater. Sci. 30 (2000), pp. 299-333.

Yoon, et al., "Molecular Layer Deposition of Hybrid Organic-Inorganic Alucone Polymer Films Using a Three-Step ABC Reaction Sequence", Chemistry of Materials, 21 (2009), pp. 5365-5374.

* cited by examiner

CROSS-POINT MEMORY AND METHODS FOR FABRICATION OF SAME

REFERENCE TO RELATED APPLICATIONS

The present application for patent is a continuation of U.S. patent application Ser. No. 15/858,811 by Sciarrillo, entitled "Cross-Point Memory and Methods for Fabrication of Same," filed Dec. 29, 2017, which is a divisional of U.S. patent application Ser. No. 15/398,475 by Sciarrillo, entitled "Cross-Point Memory and Methods for Fabrication of Same," filed Jan. 4, 2017, which is a divisional of U.S. patent application Ser. No. 14/189,265 by Sciarrillo, entitled "Cross-Point Memory and Methods for Fabrication of Same," filed Feb. 25, 2014, assigned to the assignee hereof, and each of which is expressly incorporated by reference in its entirety herein.

This application is related to U.S. patent application Ser. No. 14/189,490 by Ravasio et al., entitled "Cross-Point Memory and Methods for Fabrication of Same," filed Feb. 25, 2014 and U.S. patent application Ser. No. 14/189,323 by Song et al., entitled "Semiconductor Structures Including Liners Comprising Alucone and Related Methods," filed Feb. 25, 2014.

BACKGROUND OF THE INVENTION

Field of the Invention

Subject matter disclosed herein generally relates to integrated circuit devices, and in particular to cross-point memory arrays and methods for fabricating the same.

Description of the Related Art

Generally, a cross-point memory array refers to a memory array having memory elements disposed and electrically connected at cross junctions between a first set of conductive lines (e.g., word lines) and a second set of conductive lines (e.g., bit lines) overlapping and crossing the first set of conductive lines. Some cross-point memory arrays incorporate memory elements whose resistance can be changed by a signal applied across the memory elements. Examples of resistance change materials include phase change materials.

Fabrication of cross-point memory arrays can include patterning the memory elements having multiple elements in a stacked configuration. Patterning the memory elements, which often involve etching at least portions of a stack of materials to form a stacked structure, for example a stack of lines, can result in undesirable effects such as damaging and contaminating sidewalls of the stacked structure being etched. Thus, there is a need for fabrication methods that can minimize such undesirable effects.

BRIEF DESCRIPTION OF THE DRAWINGS

Claimed subject matter is particularly pointed out in the concluding portion of the specification. However, organization and/or method of operation, together with certain objects, features, and/or advantages thereof, may be better understood by reference to the following detailed description if read with the accompanying drawings in which:

Figure 1:
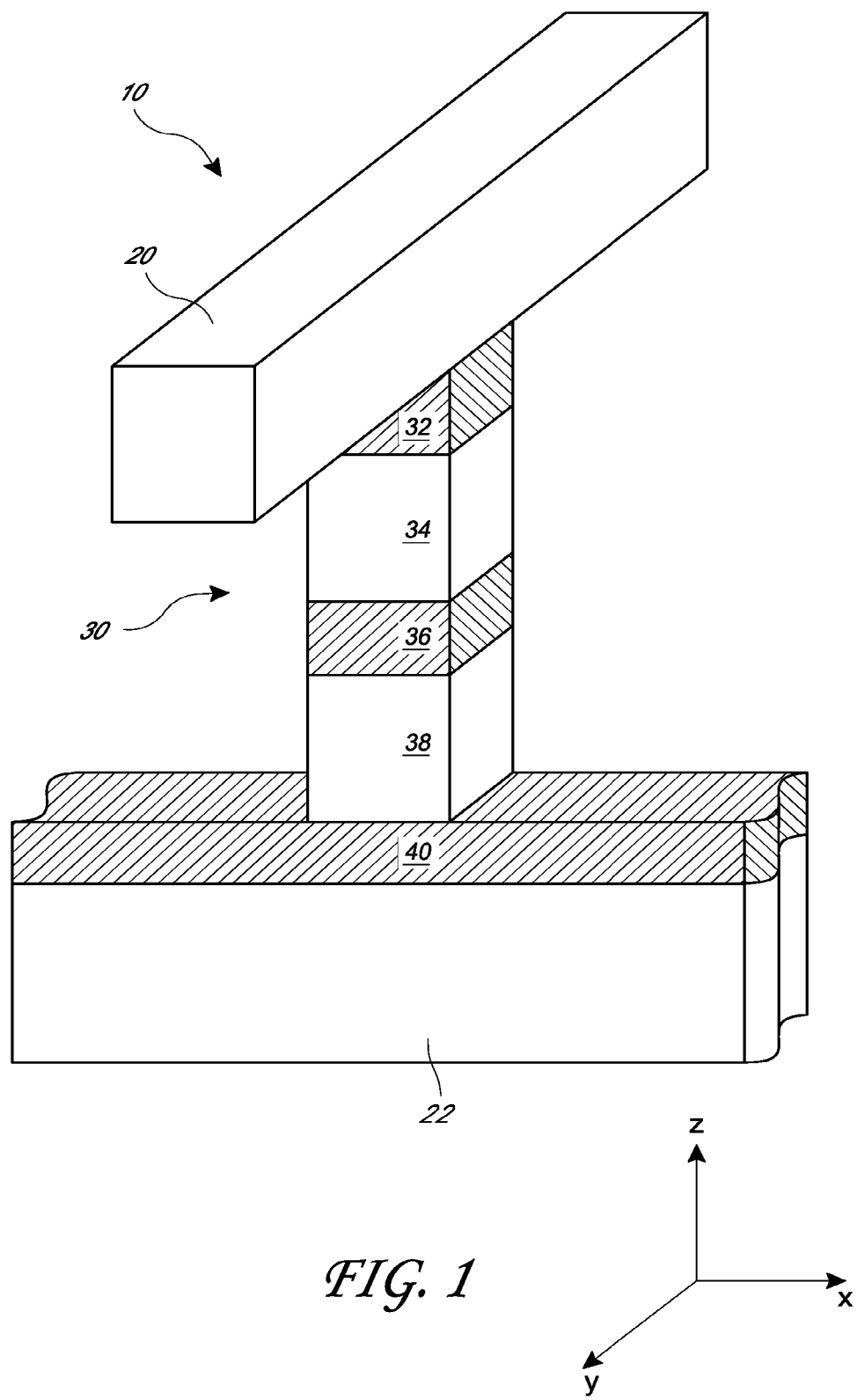
FIG. 1 is a schematic three-dimensional depiction of a memory cell according to some embodiments.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Generally, a cross-point memory array refers to a memory array having memory cells disposed and electrically connected at cross-junctions between a first set of conductive lines (e.g., word lines) and a second set of conductive lines (e.g., bit lines) overlapping and crossing the first set of conductive lines. The memory cells can change their memory state in response to a signal, which can be an electrical signal such as a voltage or a current pulse. Some memory cells, sometimes called the resistance change cells, incorporate resistance change materials whose electrical resistance can be changed by the electrical signals provided through the first and second conductive lines connected to the resistance change materials. One category of such resistance change materials is that of phase change materials.

The memory cells in a cross-point memory array can include multiple elements arranged in a stacked configuration. For example, a memory cell can include a storage element and a selector element, as well as electrodes electrically connecting the storage and selector elements with each other and to conductive access lines. Patterning the memory cell having the multiple elements, which often involves etching at least portions of a stack of materials to form a stacked structure, for example a stack of lines, can result in undesirable effects such as damaging and/or contaminating sidewalls of the stacked structure being etched. For example, a particularly efficient patterning scheme can deposit blanket layers for the conductive lines and employ two patterning processes to pattern all three of a lower line, a crossing upper line and a pillar of memory cell layers between them. However, during etching, sidewalls of one of the storage or selector elements can become damaged chemically and/or physically, and by-products from such damage can become deposited elsewhere, for example on the other of the storage or selector elements. Such contamination can be thermally "driven-in" in subsequent processes, thereby causing unintended and undesirable effects on the final device characteristics as well as fabrication yield. Thus, there is need for fabrication methods that can minimize such undesirable effects.

A method of fabricating a memory device is disclosed below according to some embodiments, including forming a memory stack structure which can include, for example, storage and selector elements arranged in a stacked configuration. The method includes forming protective dielectric materials on portions of sidewalls of the memory stack structures by, for example, first forming an initial protective dielectric material that covers sidewalls of the entire stack structure and removing a portion thereof to partially expose other portions of sidewalls of the memory stack structures. The protected and exposed portions of the memory stack structure can be disposed vertically adjacent to one another. For example, sidewalls of one of the storage or the selector elements can be exposed while leaving the sidewalls of the remaining one of the storage or the selector elements covered by the dielectric material. The element whose sidewalls remain covered can be, for example, the upper one of the storage and selection elements, which can be the element that is more prone to damage by subsequent processes, or the element whose elemental composition, when incorporated into other portions of the memory stack and/or the memory device, can detrimentally affect the performance and/or yield of the memory device.

FIG. 1 depicts a memory cell 10 in a cross-point memory array according to one embodiment. The memory cell 10 in FIG. 1 is a resistance change memory cell arranged in a stacked configuration between a column line 20 extending in a y-direction and a row line 22 extending in an x-direction. While a single memory cell 10 interposed between one column line 20 and one row line 22 is disclosed, it will be understood that a memory array can include additional memory cells formed at a subset of crossings between a plurality of column lines 20 and a plurality of row lines 22. Column lines 20 can alternately be referred to as bit lines, or more generally as digit lines, and row lines 22 can alternately be referred to as word lines, or more generally as access lines, by convention in the industry, although these designations and associated driver circuitry can also be reversed. The row and column lines 22 and 20 are conductive lines configured to carry electrical signals such as, for example, a voltage or a current pulse. The memory cell 10 includes a memory cell stack 30 including a selector element 38 and a storage element 34, and in the illustrated embodiment these elements are separated by a middle electrode 36. The memory cell 10 additionally includes a first electrode 40 between the selector element 38 and the row line 22 and a second electrode 32 between the column line 20 and the storage element 34. The electrodes, which can serve as electrical connectors, can also prevent unwanted material reaction or interdiffusion and can also serve as heating elements in operation.

Embodiments modified from the illustrated embodiments of FIG. 1 are possible. For example, while the illustrated embodiment in FIG. 1 shows the first electrode 40 configured as a line structure laterally confined in one dimension and extending above the column line 22 and the second electrode 32 configured as a structure laterally confined in two dimensions, the opposite configuration is possible, where the first electrode 40 is configured as a structure laterally confined in two dimensions and the second electrode 32 is configured as a line structure laterally confined in one dimension and extending below the row line 20. In other embodiments, both the first and second electrodes 40 and 32 can be laterally confined in one or two dimensions. In other embodiments, the positions of the storage element 34 and the selector element 38 within a stack configuration may be interchanged with one another. In yet other embodiments, the selector element 38 may be omitted. In yet other embodiments, any one of the first, second, and middle electrodes may be omitted, depending upon compatibility or reactivity of adjacent materials. Additionally, the "row" and "column" designations are interchangeable, and the rows and columns are illustrated as being perpendicular to one another but may cross one another at other than 90°.

Examples of the storage element 34 include a chalcogenide-based phase change material-based storage element, a resistive random access memory (RRAM) storage element (e.g., NiO, HfO$_2$, ZrO$_2$, Cu$_2$O, TaO$_2$, Ta$_2$O$_5$, TiO$_2$, SiO$_2$, A$_1$2O$_3$), a conductive bridge random access memory (CBRAM) storage element (e.g., metal-doped chalcogenide), and/or a spin transfer torque random access memory (STT-RAM) storage element, among other types of memory cells.

Examples of the selector element 38 include a two terminal device (e.g., a switch), such as a diode, an ovonic threshold switch (OTS), a tunnel junction, or a mixed ionic electronic conduction switch (MIEC), among other two terminal devices. Alternatively, examples of the selector element 38 include a three terminal device (e.g., a switch), such as a field effect transistor (FET) or a bipolar junction transistor (BJT), among other switching elements.

In some embodiments, one or both of the storage and selector elements 34 and 38 can comprise chalcogenide materials. When both storage and selector elements 34 and 38 comprise chalcogenide materials, the storage element 34 can comprise a chalcogenide material that can undergo a phase change that is nonvolatile at room temperature. On the other hand, the selector element 38 can comprise a chalcogenide material that does not undergo a similar nonvolatile phase change.

In some embodiments, the storage element 34 includes a phase change material that includes chalcogenide compositions such as an alloy including at least two of the elements within the indium(In)-antimony(Sb)-tellurium(Te) (IST) alloy system, e.g., In$_2$Sb$_2$Te$_5$, IniSb$_2$Te$_4$, IniSb$_4$Te$_7$, etc., an alloy including at least two of the elements within the germanium(Ge)-antimony(Sb)-tellurium(Te) (GST) alloy system, e.g., Ge$_8$Sb$_5$Te$_8$, Ge$_2$Sb$_2$Te$_5$, GeiSb$_2$Te$_4$, GeiSb$_4$Te$_7$, Ge$_4$Sb$_4$Te$_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage elements include Ge-Te, In-Se, Sb-Te, Ga-Sb, In-Sb, As-Te, Al-Te, In-Ge-Te, Ge-Sb-Te, Te-Ge-As, In-Sb-Te, Te-Sn-Se, Ge-Se-Ga, Bi-Se-Sb, Ga-Se-Te, Sn-Sb-Te, In-Sb-Ge, Te-Ge-Sb-S, Te-Ge-Sn-O, Te-Ge-Sn-Au, Pd-Te-Ge-Sn, In-Se-Ti-Co, Ge-Sb-Te-Pd, Ge-Sb-Te-Co, Sb-Te-Bi-Se, Ag-In-Sb-Te, Ge-Sb-Se-Te, Ge-Sn-Sb-Te, Ge-Te-Sn-Ni, Ge-Te-Sn-Pd, and Ge-Te-Sn-Pt, for example.

In some embodiments, the selector element 38 includes a chalcogenide material electrically coupled to the storage element 34 through the middle electrode 36 on one side and electrically connected to the row line 22 through the first electrode 40 on the other side. A selector device having a chalcogenide material can sometimes be referred to as an Ovonic Threshold Switch (OTS). An OTS may include a chalcogenide composition including any one of the chalcogenide alloy systems described above for the storage element 34. In addition, the selector element may further comprise an element to suppress crystallization, such as arsenic (As). Examples of OTS materials include Te-As-Ge-Si, Ge-Te-Pb, Ge-Se-Te, Al-As-Te, Se-As-Ge-Si, Se-As-Ge-C, Se-Te-Ge-Si, Ge-Sb-Te-Se, Ge-Bi-Te-Se, Ge-As-Sb-Se, Ge-As-Bi-Te, and Ge-As-Bi-Se, among others.

The electrodes 32, 36 and 40 can comprise materials that electrically connect the operational elements of the memory cell but prevent reactions among the materials. For example, where the storage element 34 and the selector element 38 comprise chalcogenide materials, it may be advantageous to place non-reactive conductors between these elements to prevent interdiffusion of their materials, and also between these elements and their respective neighboring materials, particularly conductive lines comprising metals. Examples of suitable electrode materials include one or more conductive and semiconductive materials suitable for forming electrodes including, for example, carbon (C); n-doped polysilicon and p-doped polysilicon; metals including Al, Cu, Ni, Cr, Co, Ru, Rh, Pd, Ag, Pt, Au, Jr, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

In addition, row and column lines 22 and 20 can comprise any conductive and/or semiconductive material suitable for forming conductive lines to carry electrical current for accessing the memory cells within the memory array. Examples of conductive/semiconductive materials suitable for forming row and column lines 22 and 20 include n-doped polysilicon, p-doped polysilicon; metals including Al, Cu, and W; conductive metal nitrides including TiN, TaN, and TaCN; and other conductive materials. In embodiments where one of electrodes 32 or 40 is omitted, the row line 22 or the column line 20 can serve as the electrodes in addition to carrying electrical signals.

In the following, it will be understood that while some embodiments of memory cells may be described as having certain features pertaining to storage elements and selector elements that include chalcogenide materials, the embodiments are not limited to such storage and selector materials. For example, in some embodiments, a memory cell can include a storage element including a chalcogenide phase change material, while including a selector element that does not include a chalcogenide material, such as a bipolar junction transistor or a diode. In some other embodiments, another material with similar electrical behavior as the chalcogenide phase change material may be used in place of that chalcogenide phase change material. In some other embodiments, a memory cell can include a selector element including an Ovonic threshold switching material, while including a storage element that does not include a chalcogenide material, such an oxide-based resistance change oxide material. In yet other embodiments, a memory cell can include a chalcogenide phase change material having both storage and selector functionalities without separate selector elements for these functions.

FIGS. 2A-2I are schematic three-dimensional depictions of intermediate memory array structures illustrating a method of fabricating a memory cell stack partially covered with protective dielectric materials, depicted at various stages of fabrication according to some embodiments.

While not shown for clarity and ease of illustration, it will be understood that the illustrated array structures are formed over a substrate, which can include, among other things, various peripheral and supporting circuitry, for instance CMOS transistors that form a part of column and row driver circuitry and sense amplifier circuitry, as well as sockets and wiring that connect such circuitry to the memory array through the columns and rows described above. In addition, the substrate may include one or more memory arrays, or "decks" of arrays. As used herein, the term substrate includes a bulk semiconductor substrate as well as integrated structures formed thereover.

As used herein and throughout the specification, "subtractive patterning" refers to a process sequence where structures to be defined are patterned by the removal of material. For example, a "subtractive patterning process" may include first lithographically providing etch mask structures overlapping areas to be patterned, followed by etching, such that materials in areas covered by the mask structures are protected while materials in exposed areas are removed by the etch removal process. The set of process steps for subtractive-patterning a stack of layers, can include, for example, providing an etch mask pattern that can comprise one or more of a resist, hard mask, and anti-reflective coating. The resist maybe be a photoresist patterned by a photolithography process. Other lithographic techniques are also possible, including processes without hard mask layers. The etch mask pattern blocks areas covered by the mask pattern to protect the underlying material from being etched (e.g., wet or dry), while the etch mask pattern exposes areas not covered by the mask pattern to etch the exposed region.

Figure 2A:
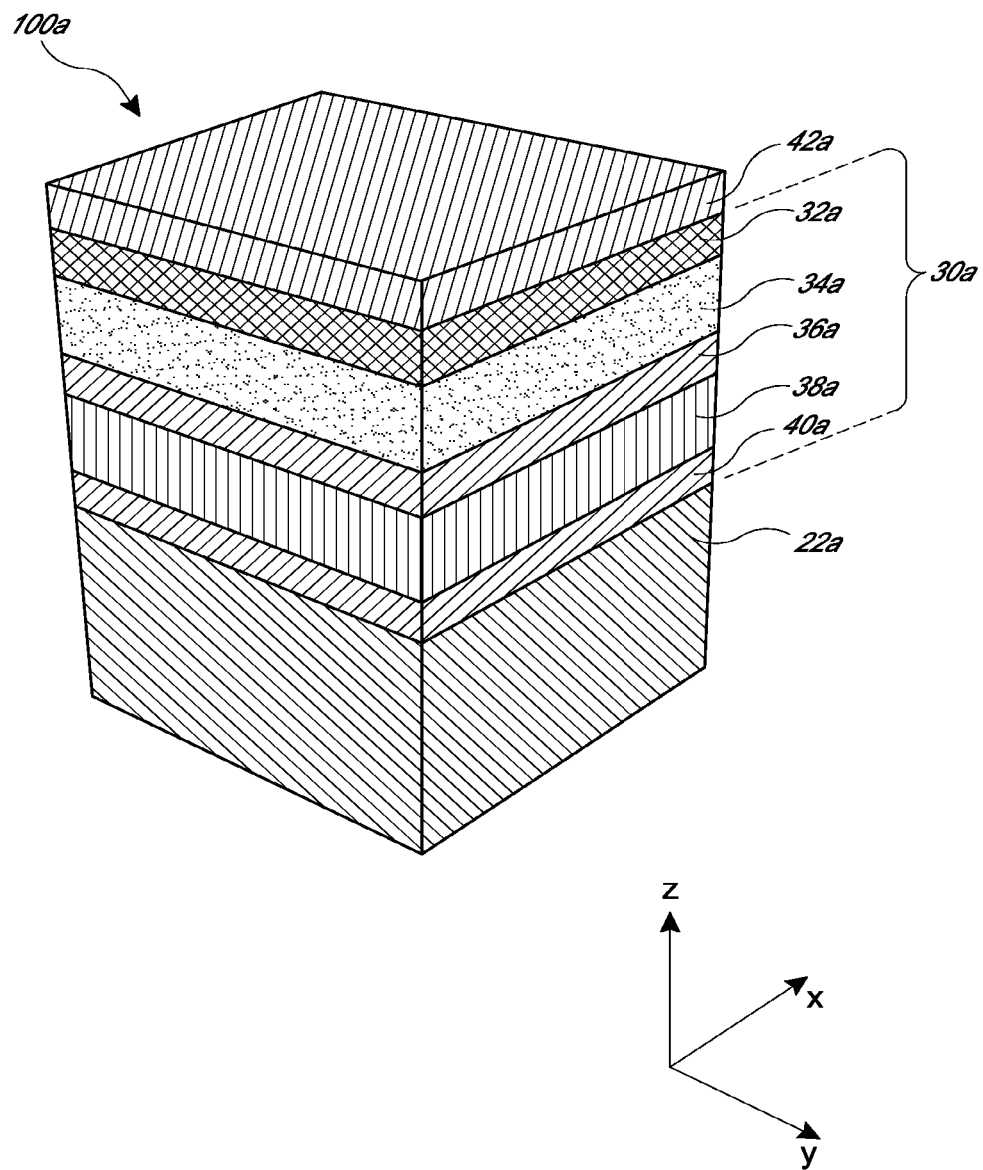
FIGS. 2A-2I are schematic three-dimensional depictions of intermediate structures of a memory cell at various stages of fabrication according to some embodiments.

Referring to intermediate array structure 100a of FIG. 2A, according to some embodiments, the method of fabricating the memory cell includes forming a lower conductive material 22a over a substrate (not shown), forming a cell material stack 30a over the lower conductive material 22a, and forming a first hard mask material 42a over the cell material stack 30a. Forming the cell material stack 30a in turn includes forming a lower electrode material 40a on the lower conductive material 22a, forming a selector element material 38a on the lower electrode material 40a, forming a middle electrode material 36a on the selector element material 38a, forming a storage element material 34a on the middle electrode material 36a, forming an upper electrode material 32a on the storage element material 34a, and forming a first hard mask material 42a on the upper electrode material 32a. The foregoing features may be formed, for example, by deposition techniques such as physical deposition (PVD), chemical vapor deposition (CVD), and atomic layer deposition (ALD), among other deposition techniques. Each feature may be initially formed as a blanket layer over an entire substrate, such as a wafer.

Figure 2B:
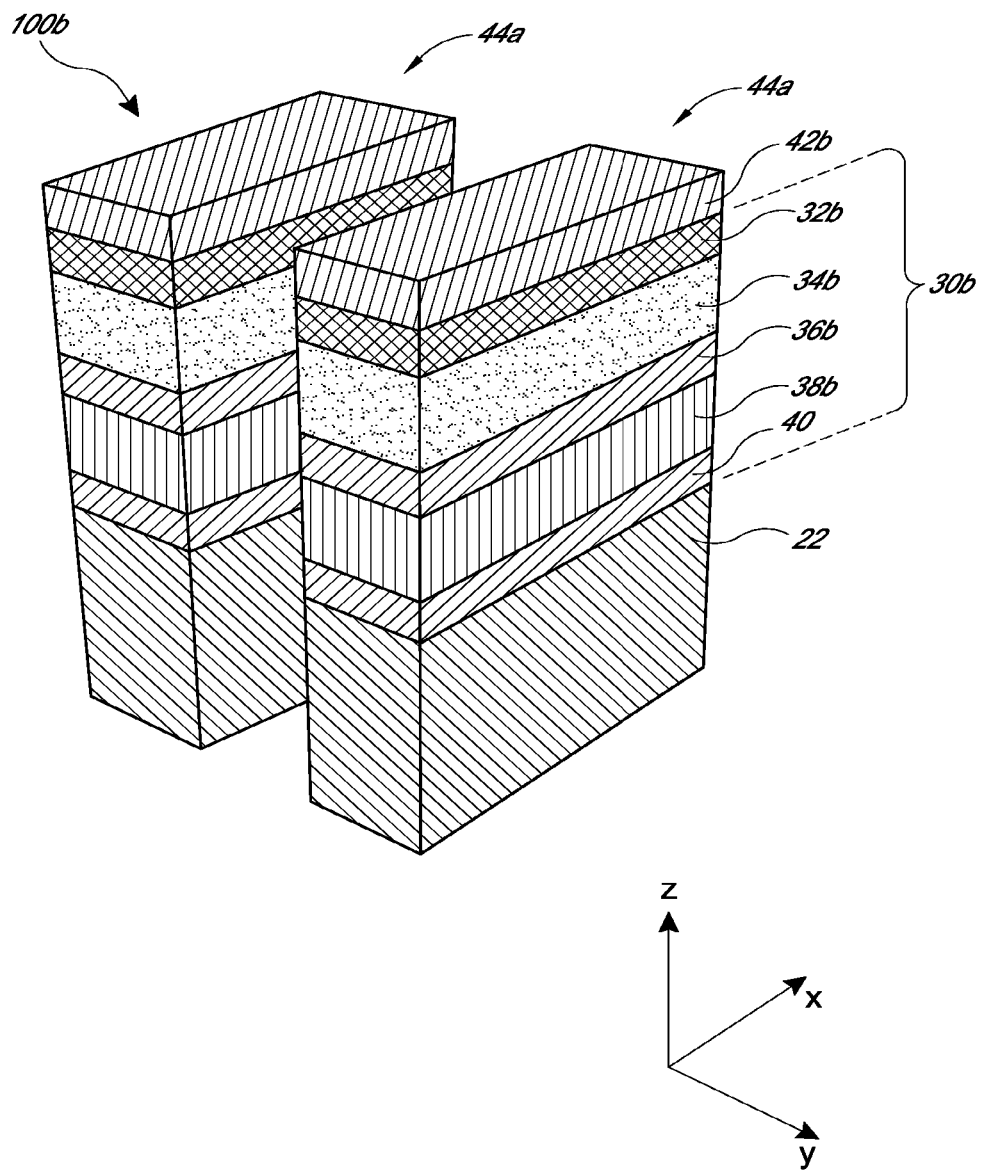

Referring to intermediate array structure 100b of FIG. 2B, according to some embodiments, the method includes patterning the stack of the intermediate array structure 100a of FIG. 2A to form a lower line stack 44a extending in the x-direction. Subtractive patterning the lower line stack 44a includes forming an etch mask line pattern (e.g., photoresist pattern, not shown) comprising lines extending in the x-direction and etching the material stack between exposed regions between the etch mask pattern lines. The resulting lower line stack 44a is formed by etching, starting from the top, the first hard mask material 42a, the cell material stack 30a, and the lower conductive material 22a of FIG. 2A to form the lower line stack 44a including a lower conductive line 22 on the substrate, a cell line stack 30b on the lower conductive line 22, and a first hard mask line 42b on the cell line stack 30b. The cell line stack 30b includes a lower electrode line 40 on the lower conductive line 22, a selector element line 38b on the lower electrode line 40, a middle electrode line 36b on the selector element line 38b, a storage element line 34b on the middle electrode line 36b, and an upper electrode line 32b on the storage element line 34b. It will be appreciated that under some circumstances, the first hard mask material 42a may be substantially removed near the completion of the subtractive patterning process that forms the lower line stack 44a. It will be appreciated that only small segments of two lines are shown, but in practice many parallel lines may be formed, extending across a memory array region.

Subtractive patterning as described above involves removing various materials including the hard mask material 42a and the cell material stack 30a from exposed regions of the material stack of FIG. 2A between etch mask (e.g., photoresist) lines. As discussed above, the various materials can include, storage and selector materials 34a and 38a formed of, for example, chalcogenide materials, and the lower, middle, and upper electrode materials 40a, 36a, and 32a formed of, for example, carbon or other conductive materials, and the hard mask material formed of, for example, a dielectric material, at least some of which are removed using dry etch removal processes, such as reactive ion etching processes.

Dry etch processes are often tailored for specific material compositions and a particular physical profile desired. Some dry etch processes may utilize chemical reactions by employing various etchants comprising, for example, a halide, such as a fluorine-, chlorine-, bromine- or iodine-containing vapor compound, to form a volatile chemical compound with the material being removed. Some other dry etch processes may utilize physical energy by employing acceleration of charged species which may be etchants themselves, or a combination of the etchants and other species such as inert ions. Yet some other dry etch processes may utilize a combination of both chemical reactions and physical energy for optimized etching performance.

It will be appreciated that some dry etch processes for patterning the lower line stack 44a of FIG. 2B having several different types of materials can sometimes leave some portions of the sidewalls of lower line stack damaged because of the chemical and the physical processes involved in the etch process as discussed above. Under some circumstances, such damaged sidewalls can result in undesirable electrical properties of the resulting memory cells, such as a shift in the threshold/switching voltage of the memory cells, as one example.

In addition, it will be appreciated that some dry etch processes for patterning the lower line stack 44a of FIG. 2B having several different types of materials can involve multiple sub-processes, where each sub-process may be tailored to remove a specific material within the lower line stack. However, a sub-process tailored for removing a particular material can result in one of several undesirable consequences. For example, without being bound to any theory, a material being removed can redeposit elsewhere without being fully volatilized and removed from a process chamber. For example, after removing materials up to and including the middle electrode material 36a, during a sub-process tailored to remove the selector element material 38a to form the selector element line 38b, atoms, molecules, or clusters of the selector element material 38a can be released and re-deposited elsewhere. For example, the released atoms, molecules, or clusters of the selector element material 38a, which can include any of the example elements of the chalcogenide material described above (e.g., As and/or Se), can re-deposit on sidewalls that have already been formed, such as sidewalls of the storage element line 34b. Materials released from the selector can contaminate the sidewalls or the bulk material of the storage element line 34b, resulting in unintended change in electrical performance of the resulting memory cells, such as a shift in the threshold/switching voltage of the memory cells, to name one example. Similarly, material from the lower conductive material 22a can redeposit on sidewalls and contaminate the selector element material and/or the storage element material during the etch of the lower conductive material 22a.

To avoid such contamination and unintended changes in the electrical performance of the memory cells that can result from the dry etch processes described with respect to FIG. 2B, it can be advantageous to clean at least portions of the sidewalls of the lower line stack 44a after partially or fully etching to form the lower line stack 44a. However, a cleaning process designed for cleaning one portion of the sidewalls itself can also lead to undesirable results, such as untended removal of material from the portion of the sidewalls and redeposition at other portions of the sidewalls, and vice versa. By way of an example, a wet cleaning process may be employed after fully etching to form the lower line stack 44a to remove contaminants (e.g., Se) from the sidewalls of the storage element line 34b. Such cleaning process can, however, result in unintended removal of additional contaminants (e.g., additional Se) from the exposed sidewalls of the selector element line 38b, resulting in further contamination of the storage element line 34b. Thus, in the descriptions that follow, methods to prevent such cross-contamination are disclosed.

Figure 2C:
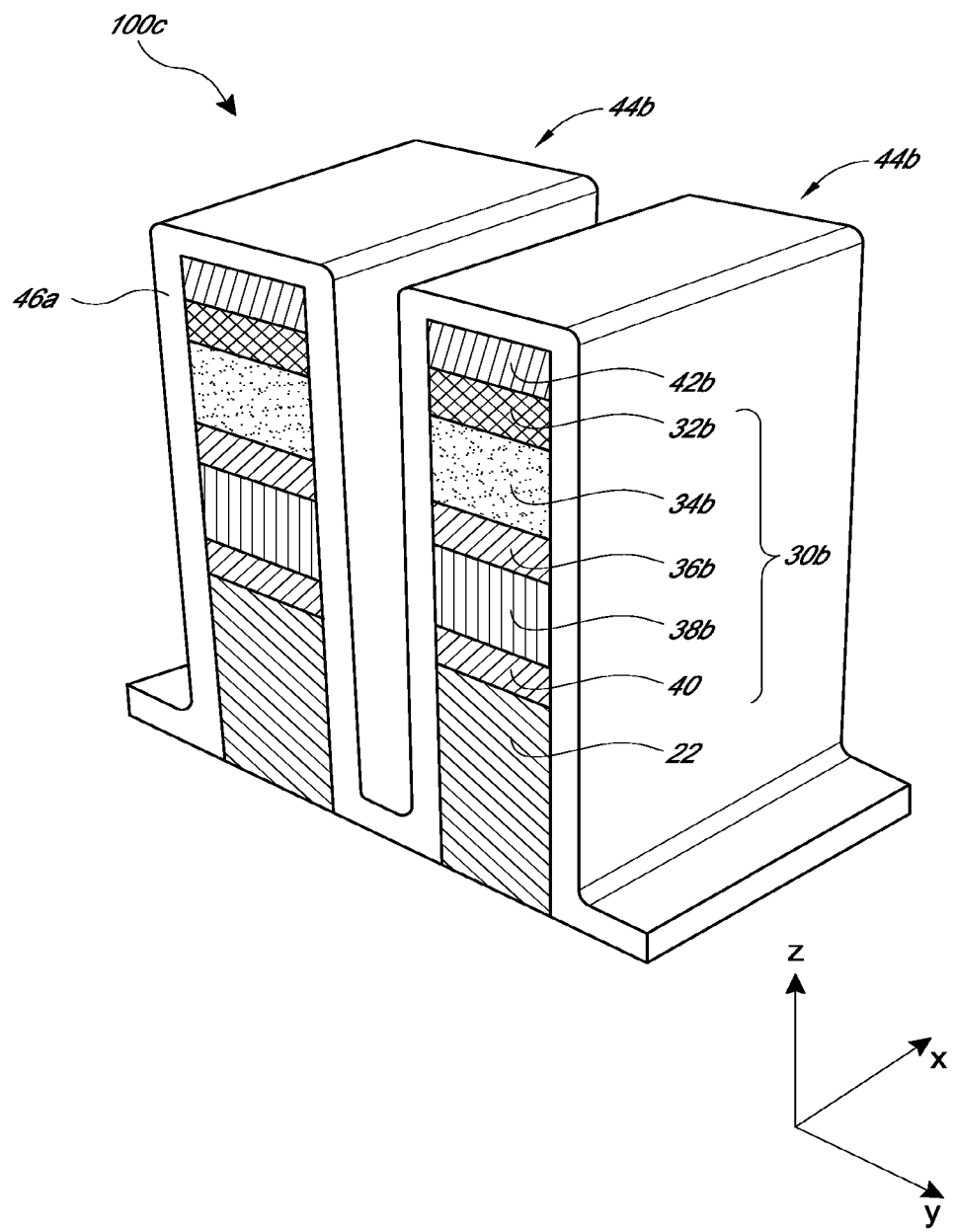

Referring to intermediate array structure 100c of FIG. 2C, according to some embodiments, fabricating the memory cell stack additionally includes forming an initial protective dielectric material 46a covering sidewalls of the lower line stack 44a of FIG. 2B including sidewalls of the lower conductive line 22, sidewalls of any remaining portions of the cell line stack 30b and sidewalls of the first hard mask line 42b, to form a lower line stack 44b having sidewalls covered with the initial protective dielectric material 46a.

In some embodiments, forming the initial protective dielectric material 46a includes depositing a conformal protective dielectric material, which uniformly and substantially covers all exposed surfaces of the intermediate structure 100c of FIG. 2C, including the sidewalls of the lower line stack 44a and inter-line stack regions between adjacent lower line stacks 44a. As used herein, a conformal initial protective dielectric material 46a has thicknesses on various portions of exposed surfaces that are substantially the same. Thus, when conformal, the initial protective dielectric material 46a has substantially the same thicknesses on top surface and sidewalls of the lower line stack 44b, as well as on the substrate between adjacent lower line stacks 44b.

The initial protective dielectric material 46a can include a suitable dielectric to protect at least portions of the lower line stack 44b from subsequent processes, such as subsequent cleaning processes. The initial protective dielectric material 46a can include oxide or nitride materials, such as silicon oxide (e.g., SiO2), aluminum oxide (e.g., Al2O3) and silicon nitride (e.g., Si3N4), among others. In general, the initial protective dielectric material 46a can be formed by a suitable conformal deposition technique such as chemical vapor deposition (CVD) and atomic layer deposition (ALD), including thermal and plasma deposition techniques.

Figure 2D:
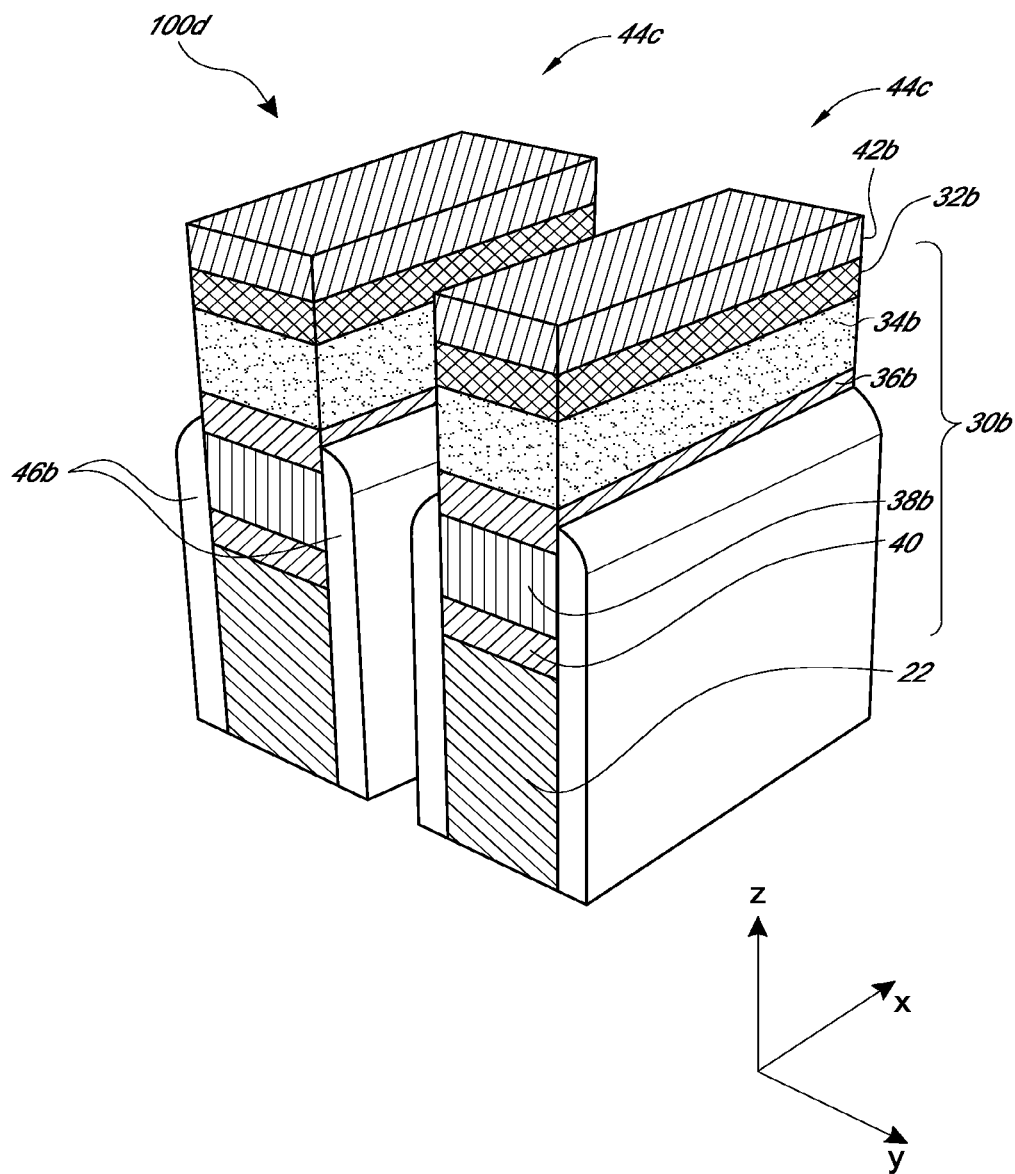

Referring to intermediate array structure 100d of FIG. 2D, fabricating the memory cell additionally includes, according to some embodiments, removing at least an upper portion of the initial protective dielectric material 46a of FIG. 2C to expose at least an upper portion of the sidewalls of the lower line stack 44b, thereby forming a lower line stack 44c of FIG. 2D having a portion of the initial protective dielectric material 46a removed therefrom. The resulting protective dielectric material 46b remains, covering at least a lower portion of the sidewalls of the lower line stack 44c.

In some embodiments, removing at least an upper portion of the initial protective dielectric materials includes a performing a "spacer etch process," which is a directional etch process designed to remove the initial protective dielectric material 46a predominantly in a vertical direction (z-direction) such that the initial protective dielectric material 46a is completely removed from horizontal surfaces (e.g., surfaces formed in the x-y plane including the top surface of the lower line stack 44c and the substrate surface between adjacent lower line stacks 44c) of exposed surfaces while the initial protective dielectric material 46a remains over vertical surfaces (e.g., surfaces formed in the x-z and x-y planes). Spacer etch processes can include sputter etching or reactive ion etching, for example.

In the illustrated embodiment of FIG. 2D, removing at least an upper portion of the initial protective dielectric material includes performing an extended spacer etch to additionally remove the initial protective dielectric 46a from an upper portion of the lower line stack 44b of FIG. 2C to expose an upper portion of sidewalls of the lower line stack 44b. The exposed upper portion of sidewalls includes sidewalls of the storage element line 34b. In the illustrated embodiment, exposed upper portion of sidewalls additionally includes sidewalls of the first hard mask line 42b if still present, sidewalls of the upper electrode line 32b, and at least a portion of the sidewalls of the middle electrode line 36b. On the other hand, a lower portion of sidewalls of the lower line stack 44b that remains in contact with and covered by the protective dielectric material 46b includes at least sidewalls of the selector element line 38b. In the illustrated embodiment, the lower portion of the sidewalls of the lower line stack 44b that remain covered additionally includes at least a portion of sidewalls of the middle electrode line 36b, sidewalls of the lower electrode line 40 and sidewalls of the lower conductive line 22.

Still referring FIG. 2D, according to some embodiments, the method of fabricating the memory cell stack additionally includes cleaning the exposed portions of sidewalls of the lower line stack 44c while continuing to protect the sidewalls of the covered portions of sidewalls of the lower line stack 44c. In the illustrated embodiment, the method includes cleaning all exposed surfaces of the first hard mask line 42b if still present, sidewalls of the upper electrode line 32b, sidewalls of the storage element line 34b, and at least an upper portion of the sidewalls of the middle electrode line 36b not covered by the initial protective dielectric 46b. The surfaces that remain covered, however, including at least a lower portion of the sidewalls of the middle electrode line 36b and sidewalls of all layers below the middle electrode line 36b, are protected from being exposed to a cleaning agent. Thus, as discussed above, while contaminants on and/or materials of the storage element line 34b may be removed from the sidewalls of the storage element line 34b by the cleaning agent, the selector element line 38b remains protected from being exposed to the cleaning agent. By way of an example, sidewalls of the storage element line 34b that may be contaminated by atoms, molecules, or clusters of the selector element material (e.g., Se) can be cleaned without removing to release additional atoms, molecules, or clusters of the selector element material (e.g., Se).

In various embodiments, cleaning the exposed portions of sidewalls of the lower line stack 44c can be performed using any suitable wet or dry cleaning processes known in the art for cleaning dry-etched surfaces. In some embodiments, the cleaning processes may include wet and/or vapor cleaning in a solution including carboxylic acid and/or dilute hydrofluoric acid (HF). For example, the solution may include dilute hydrofluoric acid (HF) at a concentration between about 0% and 10%, or between about 0% and 5%, and/or carboxylic acid at a concentration between about 0% and about 2%, or between about 0% and about 1%, or between about 0% and about 0.5%. [0039] It will be appreciated that despite the particular example given above of protecting the selector element line 38b while exposing the storage element line 34b, the method described herein is generally applicable to protect any covered lower portion of the lower line stack 44c from atoms, molecules, or clusters of materials from any exposed upper portion of the lower line stack 44c. In other embodiments, for example, a lower memory storage element may be protected while surfaces of an upper selector element are cleaned.

Figure 2E:
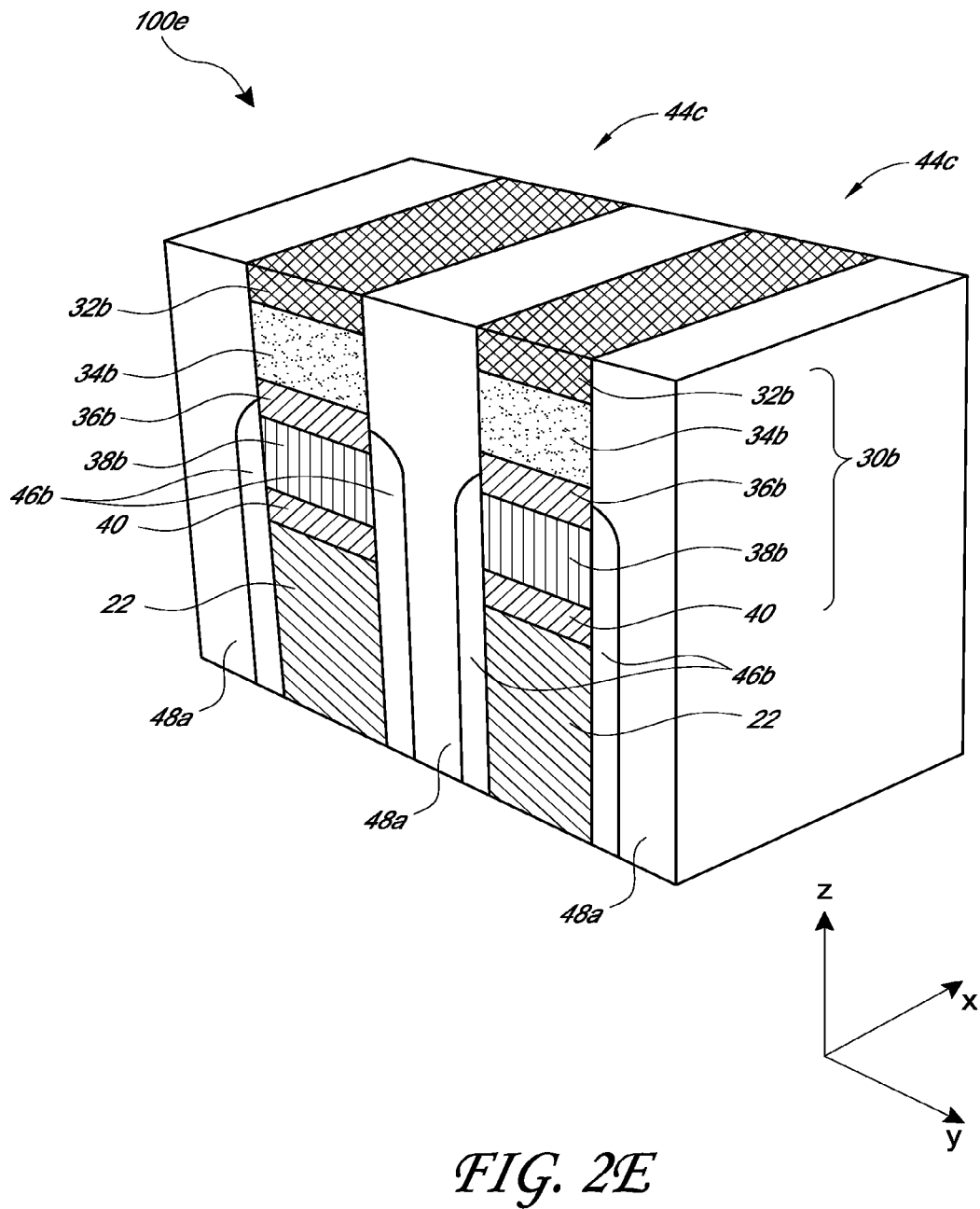

Referring to intermediate array structure 100e of FIG. 2E, according to some embodiments, after the initial protective dielectric material 46a (FIG. 2C) is removed from at least an upper portion of the lower line stack 44c to form the protective dielectric material 46b (FIG. 2D), spaces between adjacent lower line stacks 44c are filled with a dielectric material to form first isolation dielectric regions 48a. In the illustrated embodiment, the isolation dielectric regions 48a are in contact the dielectric material 46b and further in contact with upper portions of the lower line stack 44c. Suitable dielectric materials to fill the spaces can include, for example, silicon oxide and silicon nitride, which may be deposited by suitable gap-filling processes such as high-density plasma (HDP) processes, spin-on-dielectric (SOD) processes, sub-atmospheric chemical vapor deposition (SACVD) processes, and atomic layer deposition (ALD) processes, among others. Once the inter-line spaces between adjacent lower line stacks are filled with the dielectric material to form the isolation dielectric regions 48a, the intermediate array structure 100e can be chemical-mechanically polished to expose a substantially planar surface comprising alternating surfaces of the upper electrode line 32b interposed by isolation dielectric regions 48a.

Figure 2F:
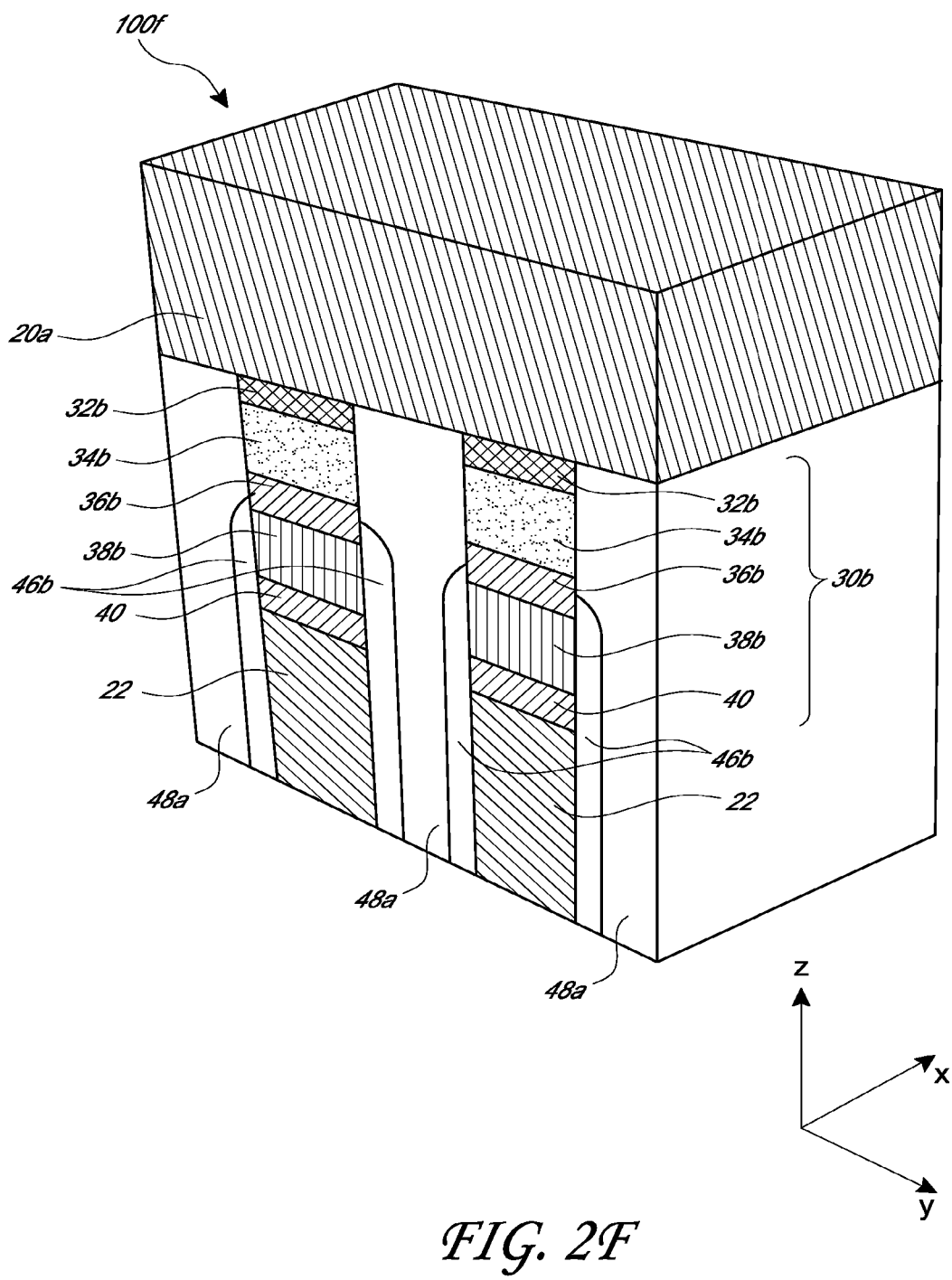

Referring to intermediate array structure 100f of FIG. 2F, according to some embodiments, the method of fabricating the memory cell stack additionally includes depositing an upper conductive material 20a. The upper conductive material 20a can comprise substantially similar materials and can be formed using substantially similar processes as discussed above for lower conductive material 22a of FIG. 2A.

Figure 2G:
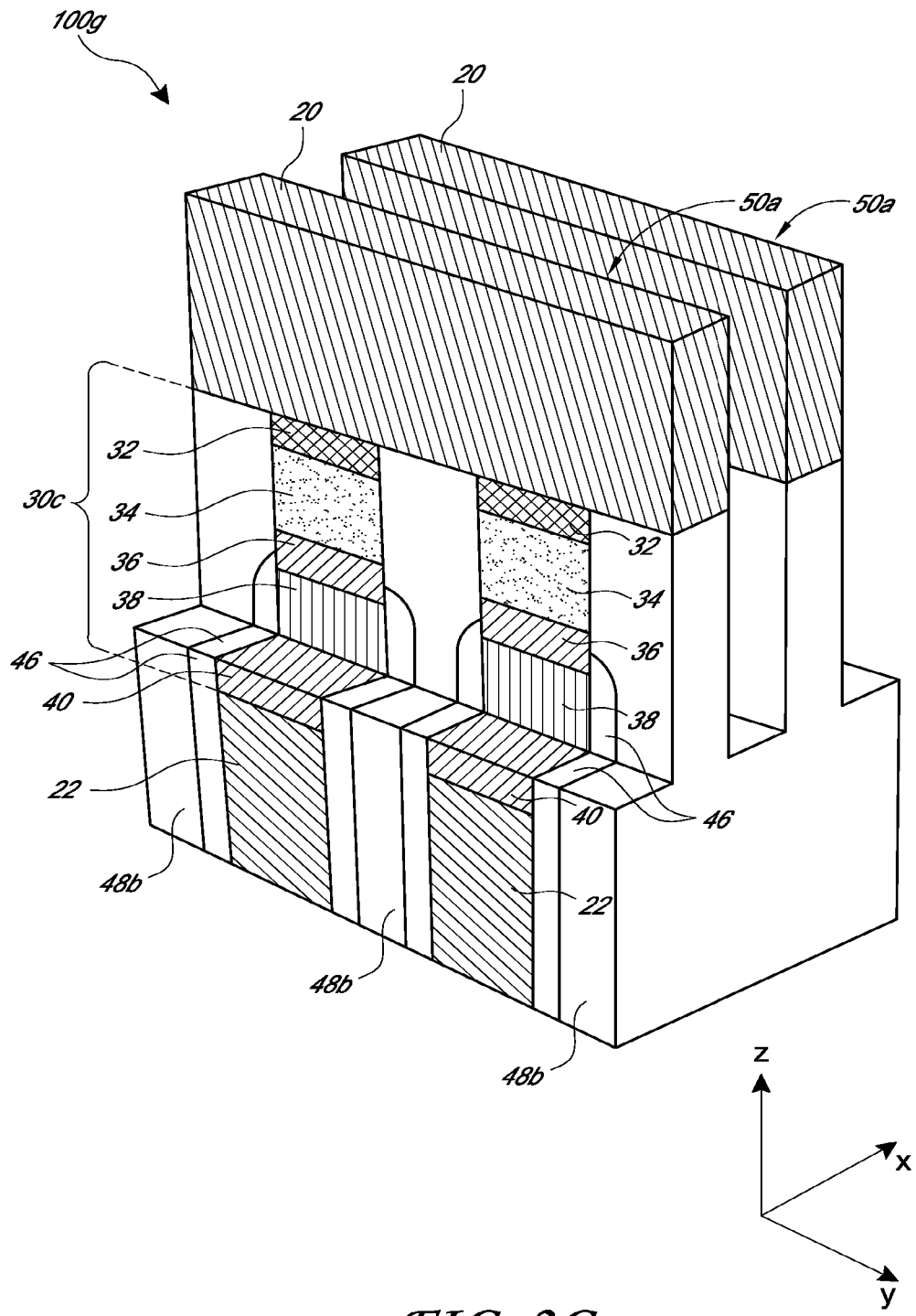

Referring to intermediate array structure 100g of FIG. 2G, according to some embodiments, the method of fabricating the memory cell additionally includes subtractively patterning to form an upper conductive line 20. Forming the upper conductive line 20, in a similar manner as described above for patterning the lower line stack 44a (FIG. 2B), includes forming an etch mask pattern comprising lines (e.g. photoresist lines, not shown for clarity) extending in the y-direction and etching the exposed regions to form the upper conductive line 20. As with the lower conductive lines 22, only short segments of two such upper conductive lines 20 are shown, spanning two memory cells each. The skilled artisan will appreciate that, in practice many parallel lines may be formed to span memory array.

Still referring to FIG. 2G, the method of fabricating the memory cell stack according to the illustrated embodiment additionally includes further subtractively etching between the mask line patterns extending in the y-direction to form a wall structure 50a. The wall structure 50a includes the upper conductive line 20 and a two-dimensionally laterally confined stack including an upper electrode 32, a storage element 34, a middle electrode 36 and a selector element 38 disposed under the upper conductive line 20. The stack can also be referred to as a pillar and is referred to herein as a cell stack 30c. The wall structure 50a further includes isolation dielectric regions 48b interposed between adjacent cell stacks 30c. In the illustrated embodiment of FIG. 2G, etching is stopped after etching to form the selector element 38 such that the resulting cell stack 30c formed between the upper conductive line 20 and the lower conductive line 22 includes the upper electrode 32, the storage element 34, the middle electrode 36, the selector element 38, and the lower electrode line 40. The subtractive etching removes the first protective dielectric material 46b (Fig. FIG. 2F) between adjacent walls 50a above the lower electrode line 40 to form the first protective dielectric material 46 shown in FIG. 2G. As described above, however, the etching can be stopped after etching any layer of the wall structure such that any one of the cell stack component layers can form a line similar to the lower electrode line 40.

Figure 2H:
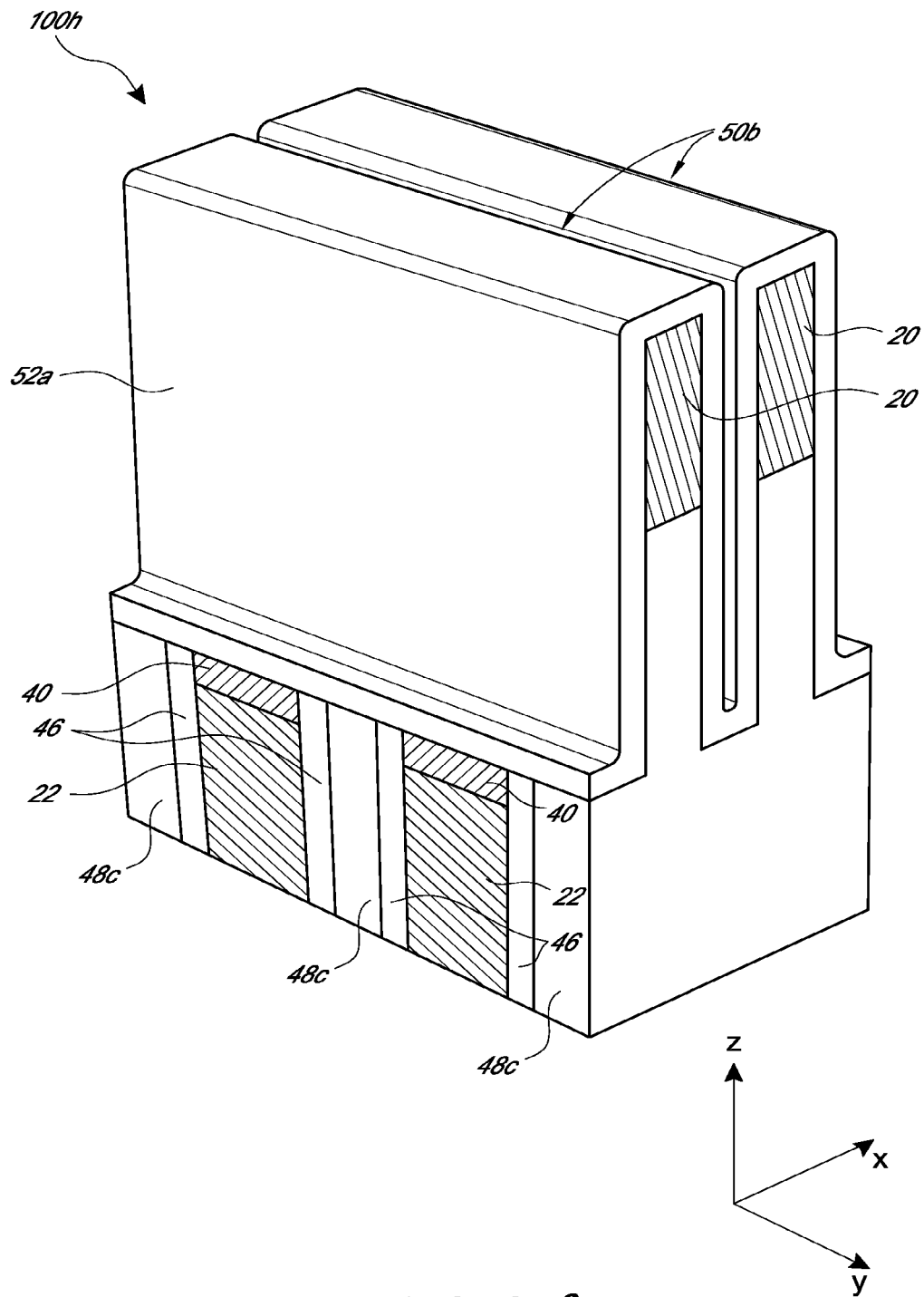

Referring to intermediate array structure 100h of FIG. 2H, according to some embodiments, the method of fabricating the memory cell stack partially covered with protective dielectric materials additionally includes forming a second initial protective dielectric material 52a over the wall structure 50a of FIG. 2G to form a covered wall structure 50b. The illustrated covered wall structure 50b includes the wall structure 50a of FIG. 2H that is uniformly covered with the second initial protective dielectric material 52a.

In some embodiments, similar to FIG. 2C, forming the second initial protective dielectric material 52a includes depositing a conformal protective dielectric material which uniformly and substantially covers all exposed surfaces of the intermediate structure 100g of FIG. 2G, including the sidewalls of the wall structure 50a and inter-wall regions between adjacent wall structures 50a. In addition, the second initial protective dielectric material 52a can include similar materials and can be deposited using similar techniques as the initial protective dielectric material 46a discussed above in reference to FIG. 2C.

Figure 2I:
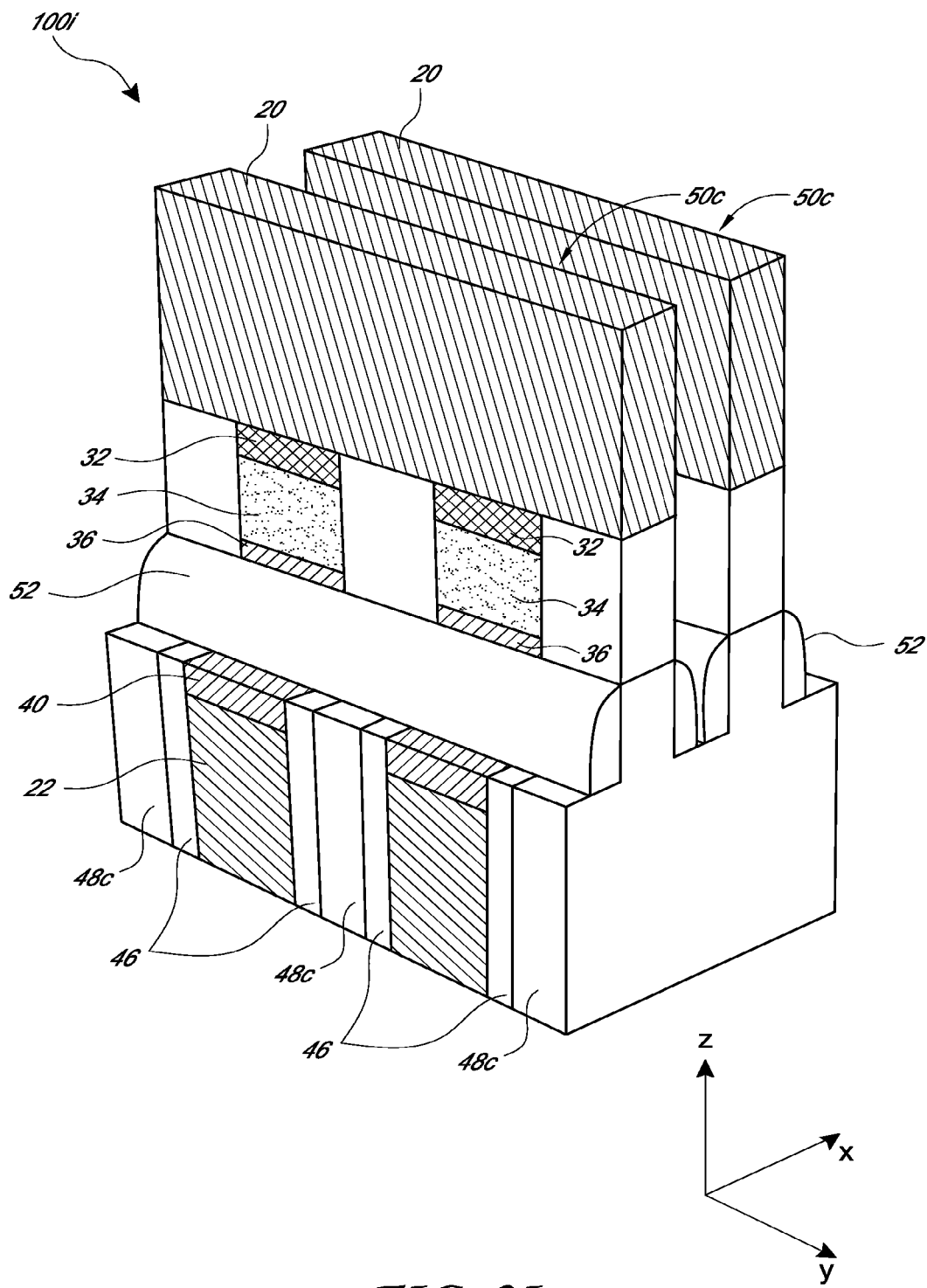

Referring to intermediate array structure 100i of FIG. 2I, according to some embodiments, the method of fabricating the memory cell stack additionally includes removing at least an upper portion of the second initial protective dielectric material 52a of FIG. 2H. Partial removal exposes at least an upper portion of the sidewalls of the wall structure 50a (FIG. 2G) to leave a partially covered wall structure 50c, in a similar manner to that described with respect to FIG. 2D. The exposed upper portion of the sidewalls of the partially covered wall structure 50c includes at least sidewalls of the storage element 34. In the illustrated embodiment, the exposed upper portion additionally includes sidewalls of the upper conductive line 20, sidewalls of the upper electrode 32, and at least a portion of sidewalls of the middle electrode 36. The resulting second protective dielectric material 52 remains in contact to cover at least a lower portion of the sidewalls of the wall structure 50c. The lower portion of the sidewalls of the partially covered wall structure 50c that remains in contact with and covered by the second protective dielectric material 52 includes at least sidewalls of the selector element 38. In the illustrated embodiment, the covered portion additionally includes sidewalls of at least a portion of the middle electrode 36.

In some embodiments, removing at least an upper portion of the second initial protective dielectric material 52a to form the second protective dielectric material 52 includes performing a spacer etch process similar to that described above with respect to FIG. 2D. In the illustrated embodiment of FIG. 2I, performing the spacer etch includes removing the second initial protective dielectric 52a from an upper portion of the covered wall structure 50b (FIG. 2H) such that resulting partially covered wall structure 50c of FIG. 2I exposes sidewalls of the storage element 34 extending in the y-direction. In some embodiments, the spacer etch additionally exposes sidewalls of the upper conductive line 20 extending in the y-direction, sidewalls of the upper electrode 32 extending in the y-direction, and at least a portion of the sidewalls of the middle electrode 36 extending in the y-direction. The remaining second protective dielectric material 52 covers at least a portion of the sidewalls of the middle electrode 36 extending in the y-direction and sidewall surfaces of layers below the middle electrode line 36, including the selector element 38. In addition, due to the directional nature of the spacer etch process, the protective dielectric material 52a (FIG. 2H) is removed from an upper surface of the lower electrode line 40 to expose portions of the upper surface between partially covered wall structures 50c.

Still referring FIG. 2I, according to some embodiments, fabricating the memory cell stack additionally includes cleaning the exposed portions of sidewalls of the partially covered wall structure 50c while continuing to protect the sidewalls of the selector element 38 covered by the protective dielectric material 52b. Similar to FIG. 2D, the method includes cleaning exposed surfaces of the upper conductive line 20, exposed sidewalls of the upper electrode 32, exposed sidewalls of the storage element 34 and exposed portions of the sidewalls of the middle electrode 36, as well as exposed upper surface of the lower electrode line 40. The surfaces that remain covered, however, including at least a portion of the sidewalls of the middle electrode 36 extending the y-direction and sidewall surfaces of the selector element 38 extending in the y-direction, remain protected from the cleaning agent. Thus, similar to the cleaning process described with respect to FIG. 2D, while contaminants from the exposed sidewalls of the storage element 34 may be removed by the cleaning agent, all sidewall surfaces of the selector element 38 remain protected from the cleaning agent. Also similar to the cleaning process described with respect to FIG. 2D, sidewalls of the storage element 34 that may be contaminated by atoms, molecules, or clusters of the selector element material (e.g., Se) can be cleaned using any suitable wet or dry cleaning processes described with respect to in FIG. 2D, without risking the release of additional atoms, molecules, or clusters of the selector element material (e.g., Se).

Still referring to FIG. 2I, according to some embodiments, while not shown for clarity, after cleaning the exposed sidewalls of the partially covered wall structure 50c, spaces between adjacent wall structures 50c can be filled with a suitable dielectric material in a similar manner to that described in FIG. 2E. Once the spaces between adjacent partially covered wall structures 50c are filled with the dielectric material, the intermediate array structure 100i can be chemical-mechanically polished to expose a substantially planar surface comprising alternating surfaces of the upper conductive lines 20 interposed by isolation dielectric regions.

Figure 3A:
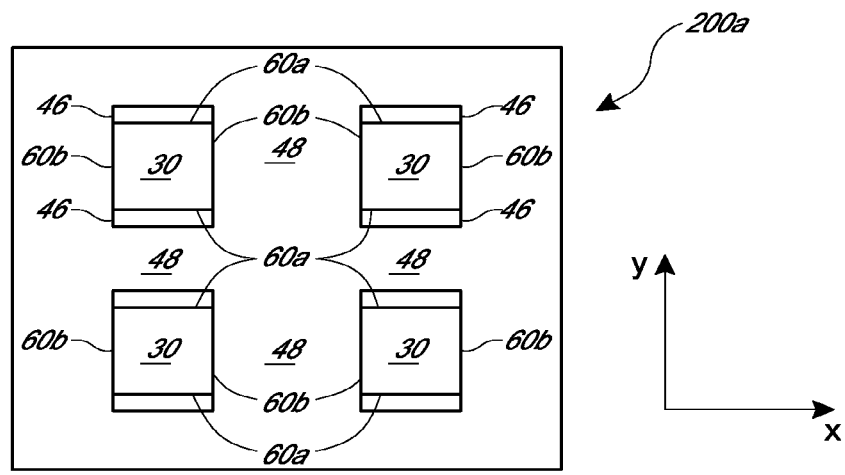
FIG. 3A-3C are horizontal cross-sectional views of structures of a memory cell according to some embodiments.
Figure 3B:
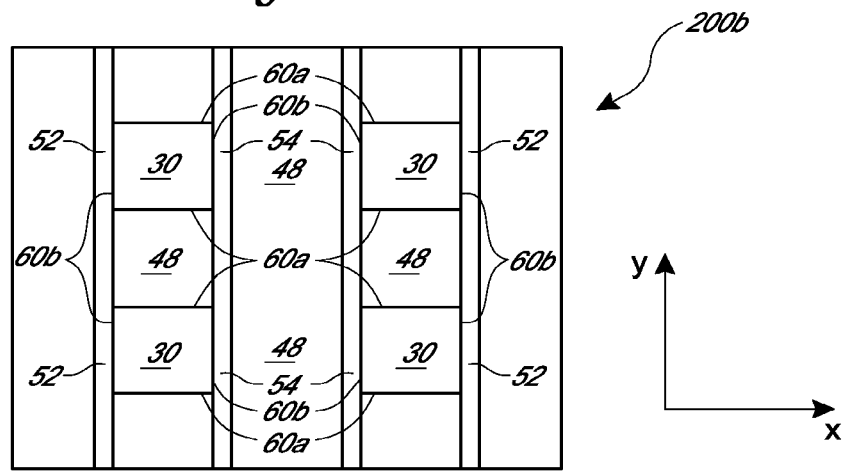
Figure 3C:
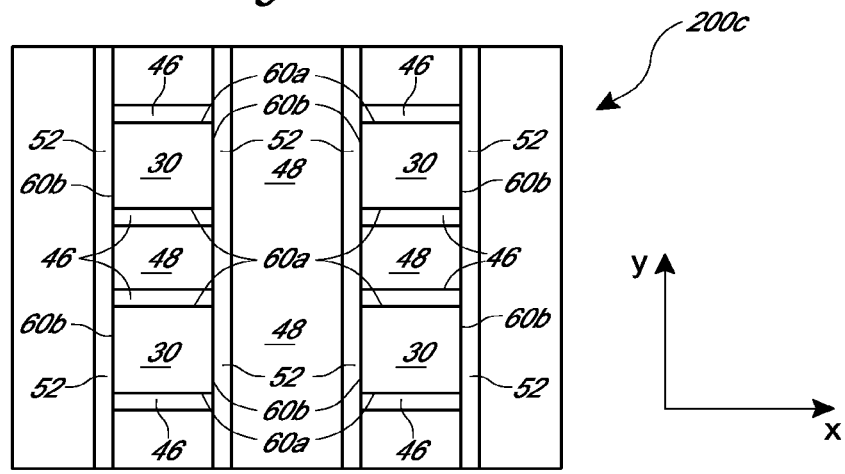

In the embodiment illustrated in FIGS. 2A-2I, the protective dielectric material 46 is formed on first sidewalls extending in the x-direction of the intermediate array structure 100b (FIG. 2B) and the second protective dielectric material 52 is formed on second sidewalls extending in in the y-direction of the intermediate array structure 100g (FIG. 2G). However, other embodiments are possible, where protective dielectric material is formed on one of the first or second sidewalls. FIGS. 3A-3C illustrates these alternative embodiments, in cross-sectional views.

FIGS. 3A-3C illustrate memory devices 200a, 200b, and 200c each comprising a memory cell stack 30 formed on a substrate, according to embodiments. The memory cell stack 30 can be similar to the memory cell stack 30 of FIG. 1. For clarity, in FIGS. 3A-3C illustrate views of the memory cell stack 30 of cross-sections made in the x-y plane, cut across a lower portion of the memory cell stack covered by at least one of the protective dielectric material 46 (FIG. 2D) and the second protective dielectric material 52 (FIG. 2I). That is, FIGS. 3A-3C can represent cross sections made in the x-y plane across the selector element 38 in FIG. 1 with at least one of the protective dielectric material 46 (FIG. 2D) and the second protective dielectric material 52 (FIG. 2I) formed on one or both of the sidewalls. Similar to FIG. 1, each of the cell stacks 30 in FIGS. 3A-3C comprises a first memory element, which can be a selector element 38, and a second memory element formed over the second memory element, which can be a storage element 34. Similar to FIG. 1, the first memory element and the second memory element can be separated by a middle electrode 36. The cell stack 30 can additionally include a first electrode 40 between the selector element 38 and the row line 22, and can further include a second electrode 32 between the column line 20 and the storage element 34.

FIG. 3A illustrated the memory device 200a including a plurality of memory cell stacks 30, according to an embodiment. Each of the memory cell stacks 30 comprises a first pair of sidewalls 60a extending in the x-direction and opposing each other, and a second pair of sidewalls 60b extending in the y-direction and opposing each other. The memory device 200a further includes protective dielectric insulating materials 46 formed on at least a portion of the first pair of sidewalls 60a. The protective dielectric insulating materials 46 can be formed on a lower portion of the first pair of sidewalls 60a such that the protective dielectric insulating materials 46 are formed on the first memory element. In addition, the protective dielectric insulating materials 46 can be formed on sidewalls of the first memory element while not formed on sidewalls of the second memory element. In addition, the protective dielectric insulating materials 46 can extend parallel to the row line 22 in the x-direction and coterminate with the first memory element in the x-direction at the second pair of sidewalls 60b. In addition, the memory device 200a can further include an isolation dielectric 48 formed on the protective dielectric insulating materials 46 and on an upper portion of the first pair of sidewalls 60a, and further formed on the second pair of sidewalls 60b, such that the isolation dielectric material 48 laterally surrounds each of the memory cell stacks 30.

FIG. 3B illustrates the memory device 200b including a plurality of memory cell stacks 30, according to another embodiment. Similar to FIG. 3A, each of the memory cell stacks 30 comprises a first pair of sidewalls 60a extending in the x-direction and opposing each other, and a second pair of sidewalls 60b extending in the y-direction and opposing each other. Unlike FIG. 3A, the memory device 200b further includes protective dielectric insulating materials 52 formed on at least a portion of the second pair of sidewalls 60b. The protective dielectric insulating materials 52 can be formed on a lower portion of the second pair of sidewalls 60b such that the protective dielectric insulating materials 52 are formed on the first memory element. In addition, the protective dielectric insulating materials 52 can be formed on sidewalls of the first memory element while not formed on sidewalls of the second memory element. In addition, the protective dielectric insulating materials 52 can extend parallel to the column line 20 in the y-direction. Unlike FIG. 3A, the protective dielectric insulating materials 52 do not coterminate with the first memory element in the y-direction at the first pair of sidewalls 60a. In addition, the memory device 200b can further include an isolation dielectric 48 formed on the protective dielectric insulating materials 52 and on an upper portion of the second pair of sidewalls 60b, and further formed on the first pair of sidewalls 60a such that the isolation dielectric material 48 laterally surrounds each of the memory cell stacks 30.

FIG. 3C illustrated the memory device 200c including a plurality of memory cell stacks 30, according to yet another embodiment. Similar to FIGS. 3A and 3B, each of the memory cell stacks 30 comprises a first pair of sidewalls 60a extending in the x-direction and opposing each other, and a second pair of sidewalls 60b extending in the y-direction and opposing each other. In FIG. 3C, the memory device 200c further includes first protective dielectric insulating materials 46 formed on at least a portion of the first pair of sidewalls 60a, similar to FIG. 3A, and further includes second protective dielectric insulating materials 52 formed on at least a portion of the second pair of sidewalls 60b, similar to FIG. 3B. That is, in FIG. 3C, the memory cell stacks 30 are laterally surrounded by dielectric insulating materials 46 and 52. Also similar to FIGS. 3A and 3B, the first and second protective dielectric insulating materials 46 and 52 can be formed on lower portions of the first and second pairs of sidewalls 60a and 60b, respectively, such that the protective dielectric insulating materials 46 and 52 surround the first memory element. In addition, the first and second protective dielectric insulating materials 46 and 52 can be formed on the first and second sidewalls of the first memory element while not formed on the first and second sidewalls of the second memory element. In addition, similar to FIG. 3A, the first protective dielectric insulating materials 46 can extend parallel to the row line 22 in the x-direction and coterminate with the first memory element in the x-direction at the second pair of sidewalls 60b, while similar to FIG. 3B, the second protective dielectric insulating materials 52 can extend parallel to the column line 20 in the y-direction and do not coterminate with the first memory element terminating in the y-direction at the first pair of sidewalls 60a. In addition, the memory device 200c can further include an isolation dielectric 48 formed on the protective dielectric insulating materials 46 and on an upper portion of the first pair of sidewalls 60a, and further formed on the protective dielectric insulating materials 52 and on an upper portion of the second pair of sidewalls 60b.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
   a substrate;
   a first memory cell stack over the substrate;
   a second memory cell stack over the substrate;
   a first protective material formed on at least a portion of a first pair of sidewalls of the first memory cell stack; and
   a second protective material formed on at least a portion of a second pair of sidewalls of the first memory cell stack, wherein a portion of the second protective material extends from the first memory cell stack to the second memory cell stack, and wherein at least a portion of the first protective material is between the substrate and the portion of the second protective material that extends from the first memory cell stack to the second memory cell stack, wherein the first protective material and the second protective material comprise a same dielectric insulating material.

2. The apparatus of claim 1, wherein the first memory cell stack further comprises a first memory element and a second memory element, and wherein the first protective material and the second protective material are formed on at least a portion of the first memory element.

3. The apparatus of claim 2, wherein the first protective material and the second protective material are formed on a portion of the first memory cell stack, and the second memory element is above the portion of the first memory cell stack and in contact with a third protective material.

4. The apparatus of claim 1, wherein the first protective material comprises at least one of $SiO_2$, $Al_2O_3$ and $Si_3N_4$ and the second protective material comprises at least one of $SiO_2$, $Al_2O_3$ and $Si_3N_4$.

5. An apparatus, comprising:
a first memory element of a first memory cell stack;
a second memory cell stack;
a first protective material formed on at least a first portion of the first memory element, the first protective material extending in a first direction; and
a second protective material formed on at least a second portion of the first memory element, wherein a portion of the second protective material extends from the first memory cell stack to the second memory cell stack in a second direction crossing the first direction, and wherein at least a portion of the first protective material is between a substrate and the portion of the second protective material that extends from the first memory cell stack to the second memory cell stack, wherein the first protective material comprises a first dielectric insulating material and the second protective material comprises a second dielectric insulating material the same as the first dielectric insulating material.

6. The apparatus of claim 5, wherein the second direction is perpendicular to the first direction.

7. The apparatus of claim 5, wherein the first protective material and the second protective material each comprise at least one of $SiO_2$, $Al_2O_3$ and $Si_3N_4$.

8. A method, comprising:
forming a first protective material on at least a portion of a first pair of sidewalls of a first memory cell stack, the first protective material extending in a first direction; and
forming a second protective material on at least a portion of a second pair of sidewalls of the first memory cell stack, wherein a portion of the second protective material extends from the first memory cell stack to a second memory cell stack in a second direction different than the first direction associated with the first protective material, and wherein at least a portion of the first protective material is between a substrate and the portion of the second protective material that extends from the first memory cell stack to the second memory cell stack, wherein the first protective material and the second protective material comprise a same dielectric insulating material.

9. The method of claim 8, wherein the second direction is orthogonal to the first direction.

10. The method of claim 8, wherein forming the first protective material further comprises:
applying chemical vapor deposition (CVD), atomic layer deposition (ALD), a thermal deposition technique, a plasma deposition technique, or a combination thereof.

11. The method of claim 8, wherein the first protective material and the second protective material each comprise at least one of $SiO_2$, $Al_2O_3$ and $Si_3N_4$.

12. The apparatus of claim 5, wherein the first protective material comprises at least one of $SiO_2$, $Al_2O_3$ and $Si_3N_4$ and the second protective material comprises at least one of $SiO_2$, $Al_2O_3$ and $Si_3N_4$.

13. The method of claim 8, wherein the first protective material comprises at least one of $SiO_2$, $Al_2O_3$ and $Si_3N_4$ and the second protective material comprises at least one of $SiO_2$, $Al_2O_3$ and $Si_3N_4$.

14. The apparatus of claim 1, wherein the first protective material is in contact with a first electrode within the first memory cell stack and with a second electrode within the first memory cell stack.

* * * * *